(12) United States Patent
Nishimura

(10) Patent No.: US 6,226,197 B1
(45) Date of Patent: *May 1, 2001

(54) MAGNETIC THIN FILM MEMORY, METHOD OF WRITING INFORMATION IN IT, AND ME

(75) Inventor: Naoki Nishimura, Tokyo (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/422,793

(22) Filed: Oct. 22, 1999

(30) Foreign Application Priority Data

Oct. 23, 1998 (JP) .................................. 10-302354

(51) Int. Cl.$^7$ ................................................... G11C 11/14
(52) U.S. Cl. ........................ 365/171; 365/158; 365/157
(58) Field of Search ................................. 365/171, 158, 365/157

(56) References Cited

U.S. PATENT DOCUMENTS 5,894,447  4/1999  Takashima ........................ 365/158
6,055,179 * 4/2000  Koganei et al. .................. 365/158

FOREIGN PATENT DOCUMENTS 6-084347  3/1994  (JP) .

\* cited by examiner

Primary Examiner—David Nelms
Assistant Examiner—Connie C. Yoha
(74) Attorney, Agent, or Firm—Fitzpatrick, Cella, Harper & Scinto

(57) ABSTRACT

The present invention relates to a magnetic thin film memory having a hybrid element including a field effect transistor and a magnetoresistive thin film connected to the field effect transistor in parallel. In the magnetic thin film memory, the hybrid element is preferably arranged in plurality in a matrix state. The present invention also relates to a method of writing information in this magnetic thin film memory, and a method of reading the information written in this magnetic thin film memory.

14 Claims, 8 Drawing Sheets

⌈1⌋

⌈0⌋

⌈1⌋

⌈0⌋

MAGNETIC THIN FILM MEMORY, METHOD OF WRITING INFORMATION IN IT, AND ME

BACKGROUND OF THE INVENTION

1. Field of the Invention

The present invention relates to a magnetic thin film memory, a method of writing information in this magnetic thin film memory, and a method of reading the information written in this magnetic thin film memory.

2. Related Background Art

Recently, the development of devices including a thin film magnetic head to which the magneto-resistance effect is applied has been promoted. Among them, a magnetic thin film memory using a magnetoresistive thin film is noted, which can be substituted for a DRAM or an EEPROM used at present. Since the magnitude of resistance of a magnetoresistive thin film can largely be changed by the state of magnetization of the magnetism, a nonvolatile solid memory can be realized by combining the magnetoresistive thin film with a semiconductor device such as a transistor.

As a conventional magnetic thin film memory, for example, a memory is proposed in Japanese Patent Application Laid-Open No. 6-84347, which is formed by connecting a magnetoresistive thin film to the source electrode of a field effect transistor (hereafter, referred to as "FET"). The configuration of this memory is shown in FIG. 1. In FIG. 1, the numeral 1 denotes a magnetoresistive thin film, and in order to show the positions in the circuit, the magnetoresistive thin films are denoted by the subnames like 1*aa*, 1*ab*, 1*ac*, 1*ba*, 1*bb* and 1*bc*, but hereafter, in the case when the positions in the circuit are not especially specified, it is simply referred to as the magnetoresistive thin film 1. Furthermore, the other numerals are also referred to similarly. The numeral 2 denotes an FET; 3, a first bit wire; 5, a second bit wire; 4, a word wire; and 6, a resistor. The word wire 4 is provided in the lateral direction of FIG. 1 and is connected to the gate electrode of the FET 2, and the first bit wire is provided in the longitudinal direction of the figure and is connected to the drain electrode of the FET 2. Furthermore, the source electrode of the FET 2 is connected to the second bit wire 5, and further, the magnetoresistive thin film 1 is connected to the second bit wire 5. The other end of the magnetoresistive thin film 1 which is not connected to the second bit wire 5 is connected to a grounding source.

FIG. 2A and FIG. 2B show cross sectional views taken along the line A—A' of the magnetoresistive thin film 1*ac* shown in FIG. 1. In the figures, arrows show the direction of the magnetic field, and the mark "∘" in the circle (i.e., the mark "⊙") shows the state where the current flows from the back to the front of the figure, and the mark "x" in the circle (i.e., the mark "⊗") shows the state where the current flows from the front to the back of the figure. Furthermore, FIG. 3A and FIG. 3B show the configuration of the magnetoresistive thin film 1.

The magnetoresistive thin film 1, as shown in FIG. 3A and FIG. 3B, comprises a giant magnetoresistive thin film in which a magnetic layer a with a large coercive force and a magnetic layer b with a small coercive force are stacked several times with interposition of a nonmagnetic layer c therebetween. The resistance value of the magnetoresistive thin film 1 is characterized in that it is small when the direction of magnetization of the magnetic layer a and the direction of magnetization of the magnetic layer b are the same, and that it is large when the direction of magnetization of the magnetic layer a and the direction of magnetization of the magnetic layer b are opposite.

In FIG. 1, when the information of "1" is written in the magnetoresistive thin film 1*ac*, a potential of $+V_3$ is applied to the first bit wire 3*c*. In this case, when a voltage of $V_4$ is applied to the word wire 4*a*, the FET 2*ac* is turned on, and a comparatively large current $I_1$ flows into the magnetoresistive thin film 1*ac* and the second bit wire 5*ac*. By this current $I_1$, a magnetic field $H_1$ is applied to the magnetoresistive thin film 1*ac*, and the magnetic layer b with a small coercive force which is shown in FIG. 3A and which relates to the writing of the magnetoresistive thin film 1 is magnetized to the left which is the direction of the magnetic field $H_1$.

On the other hand, when the information of "0" is written in the magnetoresistive thin film 1*ac*, a potential of $-V_3$ is applied to the first bit wire 3*c*. In this case, when a voltage of $V_4$ is applied to the word wire 4*a*, the FET 2*ac* is turned on, and a comparatively large current $I_0$ flows into the magnetoresistive thin film 1*ac* and the second bit wire 5*ac* in the opposite direction (from the front to the back in the figure) of the above $I_1$. By this current $I_0$, a magnetic field Ho is applied to the magnetoresistive thin film 1*ac*, and the magnetic layer b with a small coercive force which relates to the writing of the magnetoresistive thin film 1 is magnetized to the right which is the direction of the magnetic field $H_0$ as shown in FIG. 3B.

Since the FET 2*ac* is set to be turned on only when a proper voltage is applied to the word wire 4*a*, the current does not flow into other magnetoresistive thin films 1 connected to the first bit wire 3*c*.

Furthermore, since the current does not flow through the first bit wires 3 other than the first bit wire 3*c*, the current also does not flow into other magnetoresistive thin films 1 connected to the word wire 4*a*. Since the magnetic layer a with a large coercive force is initialized so that the direction of magnetization may face to the right at all times, the magnetoresistive thin film 1 is set to have a large resistance when the information of "1" is written in it and to have a small resistance when the information of "0" is written in it.

On the other hand, when reading the information written in the magnetoresistive thin film 1*ac*, a current $I_3$ is supplied into the first bit wire 3*c*, and a voltage V is applied to the word wire 4*a* so as to turn on the FET 2*ac*. Consequently, since the current $I_3$ flows only into the magnetoresistive thin film 1*ac* from the top to the bottom in the FIG. 1, the voltage Vαβ between the positions α and β at this moment is measured. In the cases of the same and opposite directions of magnetization of the magnetic layer a and the magnetic layer b constituting the magnetoresistive thin film 1*ac*, the resistance values of the magnetoresistive thin film 1*ac* are different, and therefore, the values of the voltage Vαβ are also different. Accordingly, it is possible to judge whether the information read from the magnetoresistive thin film 1*ac* is "0" or "1" by the magnitude of the voltage value of the voltage Vαβ.

FIG. 4 is a circuit diagram of the configuration of the conventional magnetic thin film memory shown in FIG. 1. The reference characters M101 to M104 denote MOS (metal/oxide/semiconductor) FET's; R101 to R104, magnetoresistive thin films; W101, a word wire; B101 to B104, bit wires; and G, a grounding wire.

FIG. 5 shows a circuit diagram in which circuits shown in FIG. 4 are arranged in the form of a matrix. One end of each of the magnetoresistive thin films R101 to R109 is connected to either the source electrode or the drain electrode of each of the MOSEFT M101 to MOSFET M109, and the other end of each of the magnetoresistive thin films R101 to R109 is connected to the grounding source. The drain electrodes of the MOSFET M101 to MOSFET M109 are connected to the bit wires B101 to B103, and the word wires W101 to W103 are arranged to the gate electrodes of the MOSFET M101 to MOSFET M109. Furthermore, the reference characters J101 to J103 denote writing wires. Accordingly, in the circuit in FIG. 5, when the MOSFET M101 and the magnetoresistive thin film R101 are magnetic thin film memory elements, wires necessary for constituting the magnetic thin film memory elements are 4 lines of the word wire W101, the bit wire B101, the grounding wire G, and the writing wire J101.

Furthermore, FIG. 6 shows one example of the device structure of the circuit shown in FIG. 4. In the device structure, the above magnetic thin film memory element is referred to as "memory cell". The numeral 101 denotes a magnetoresistive thin film; 102, a writing wire; 103, a gate electrode; 104, a bit wire; 105, a connecting electrode between the bit wire 104 and an n-type region 109; 106, a connecting electrode between the magnetoresistive thin film 101 and the n-type region 109; 107, a grounding wire; and 108, a field oxide film region composed of $SiO_2$ for electrically separating adjacent memory cells on a p-type Si substrate 110.

As mentioned above, an conventional magnetic thin film memory uses a wire functioning as a bit wire and as a writing wire, and the current passed through the bit wire when writing the information may also flow into the magnetoresistive thin film itself since the magnetoresistive thin film is made of a metal material, whereby the magnetic field necessary for the writing cannot effectively be applied to the magnetoresistive thin film. Therefore, it is required that a writing wire is newly provided near the magnetoresistive thin film in addition to the bit wire, and that the current is supplied into this writing wire to perform the writing by using the generated electric field. Furthermore, each electrode of a transistor constituting one memory cell is independent from each electrode of a transistor of an adjacent memory cell. Accordingly, in order to constitute a magnetic thin film memory element, 4 lines of wires of a bit wire, a word wire, a writing wire and a grounding wire are necessary.

In the device structure of the conventional magnetic thin film memory shown in FIG. 6, the electrodes connected to the n-type region formed on a p-type semiconductor substrate for one memory cell are two electrodes of the connecting electrode for connecting the bit wire and the n-type region and the connecting electrode for connecting the magnetoresistive thin film and the n-type region. Normally, in order to connect these two electrodes to the n-type region, contact holes are used. Accordingly, in the device structure of the above conventional magnetic thin film memory, two contact holes are needed for one memory cell. Considering the misregistration of the mask of a light exposure apparatus used when forming a contact hole, it is necessary that the area for forming a contact hole is wider than the actual occupied area of a contact hole. Accordingly, when the number of contact holes is increased, the occupied area of the memory cell becomes larger.

Furthermore, in the conventional magnetic thin film memory, a field oxide film region is provided for separating the adjacent memory cells. It is necessary that this field oxide film region has a sufficiently wide area for surely separating the adjacent memory cells on the semiconductor substrate. The contact hole and the field oxide film region need areas most when forming a memory cell, and the increase of the number of contact holes and the formation of the field oxide film region increase the occupied area of the memory cell itself as a result. Thus, a conventional magnetic thin film memory has a complex structure since the number of lines of wires is large, and it is difficult to improve the degree of integration, since the area of a memory cell is wide.

SUMMARY OF THE INVENTION

An object of the present invention is to solve the above problems of the prior art, and to reduce the number of lines of wires necessary for the memory cells configuring a magnetic thin film memory to decrease the occupied area of the memory cells while simplifying the structure.

Another object of the present invention is to provide a magnetic thin film memory comprising a hybrid element comprising a field effect transistor and a magnetoresistive thin film connected to the field effect transistor in parallel.

Still another object of the present invention is to provide the magnetic thin film memory as described above, which further comprises means for performing reading and writing of information by electrically or electromagnetically changing a resistance value of the magnetoresistive thin film.

A further object of the present invention is to provide the magnetic thin film memory as described above, in which the hybrid element is arranged in plurality in a matrix state.

A still further object of the present invention is to provide the magnetic thin film memory as described above, a source electrode of a field effect transistor of one hybrid element among the hybrid elements and a drain electrode of a field effect transistor of another hybrid element adjacent to the one hybrid element are a common electrode.

A still further object of the present invention is to provide the magnetic thin film memory as described above, in which the field effect transistor comprises a MOS (metal/oxide/ semiconductor) field effect transistor, an n-type enhancement-type transistor, or a p-type depression-type transistor.

A still further object of the present invention is to provide the magnetic thin film memory as described above, in which the magnetoresistive thin film comprises a first magnetic layer, a nonmagnetic layer, and a second magnetic layer with a coercive force larger than that of the first magnetic layer, the layers being stacked in this order.

A still further object of the present invention is to provide the magnetic thin film memory as described above, in which the magnetoresistive thin film comprises an element using giant magneto-resistance effect, a spin dependence scattering type magneto-resistance element, or a spin tunnel type magneto-resistance element.

A still further object of the present invention is to provide the magnetic thin film memory as described above, in which the first magnetic layer comprises a soft magnetic material containing Ni and/or the second magnetic layer comprises a magnetic material containing Co.

A still further object of the present invention is to provide a method of reading information from the magnetic thin film memory as described above, which comprises the steps of:

switching off a field effect transistor of one hybrid element of which information is read out, among a plurality of hybrid elements connected in series;

switching on a field effect transistor of another hybrid element other than the one hybrid element; and discriminating information stored in the one hybrid element from resistance values of the plurality of hybrid elements connected in series.

A still further object of the present invention is to provide a method of writing information in the magnetic thin film memory as described above, which comprises the steps of:

switching on a field effect transistor of one hybrid element in which information is written, among a plurality of hybrid elements connected in series;

switching off a field effect transistor of another hybrid element other than the one hybrid element; and supplying current to a plurality of hybrid elements connected in series to writing information in the one hybrid element by a magnetic field generated by drain current flowing through the field effect transistor of the one hybrid element.

DETAILED DESCRIPTION OF THE PREFERRED EMBODIMENT

Figure 1:
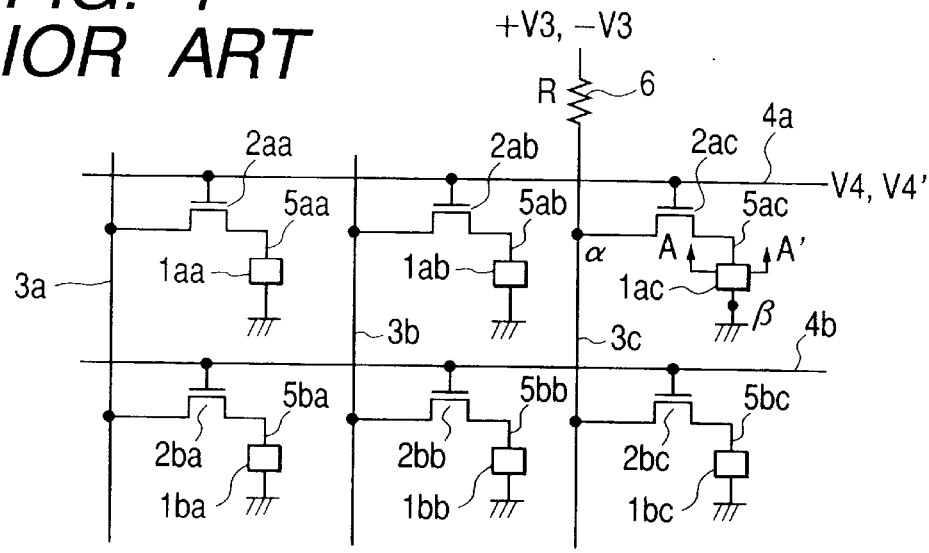
FIG. 1 is a circuit diagram showing the configuration of a conventional magnetic thin film memory.
Figure 2A:
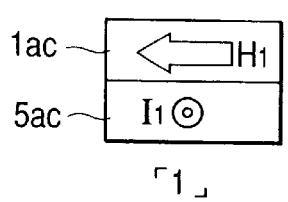
FIG. 2A and FIG. 2B are schematic cross-sectional views showing the configuration of a conventional magnetoresistive thin film and a conventional writing wire.
Figure 2B:
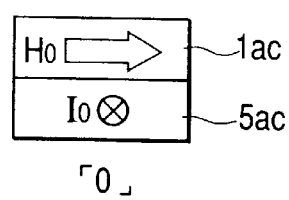
Figure 3A:
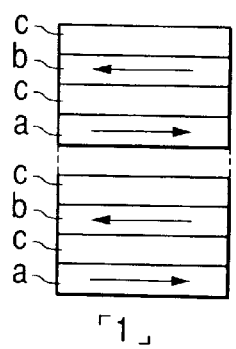
FIG. 3A and FIG. 3B are schematic cross-sectional views showing the configuration of a conventional magnetoresistive thin film.
Figure 3B:
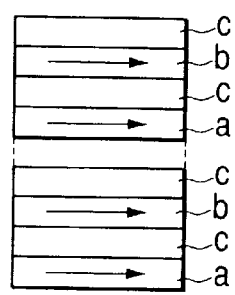
Figure 4:
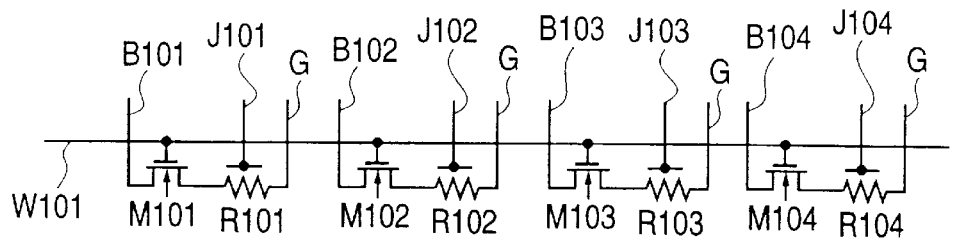
FIG. 4 is a circuit diagram of a conventional magnetic thin film memory.
Figure 5:
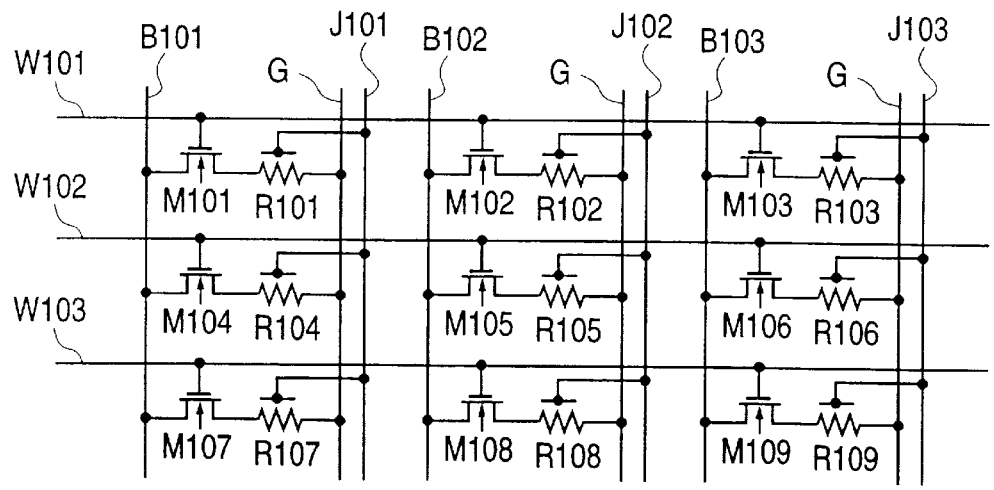
FIG. 5 is a circuit diagram showing an example in which conventional magnetic thin film memories are arranged in a matrix state.
Figure 6:
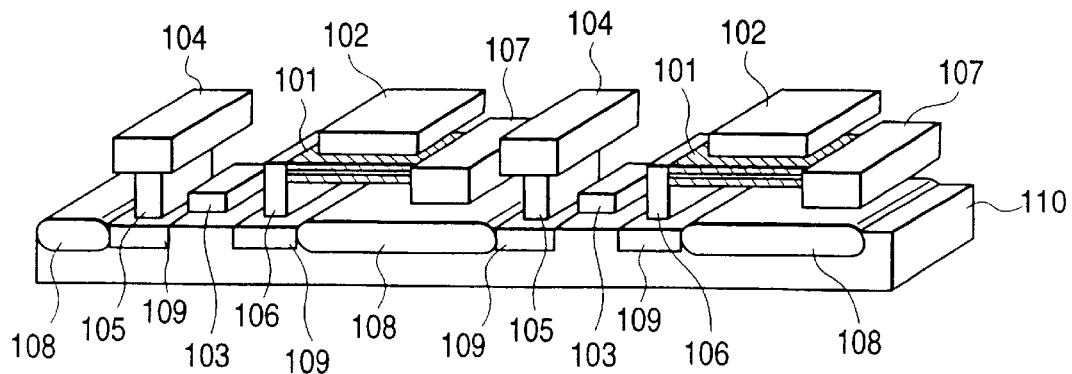
FIG. 6 is a schematic perspective view showing one example of the device configuration of a conventional magnetic thin film memory.

Next, the embodiments of the present invention will be described in detail by referring to drawings. In FIG. 7 to FIG. 21 described below, the same reference characters are given to all of the same members.

FIRST EMBODIMENT

Figure 7:
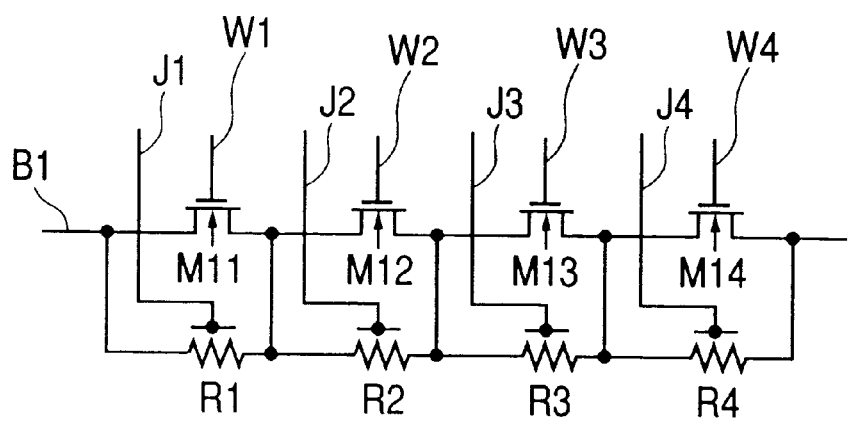
FIG. 7 is a circuit diagram showing the first embodiment of a magnetic thin film memory of the present invention.

FIG. 7 is a circuit diagram showing the configuration of the first embodiment of a magnetic thin film memory of the present invention. The reference characters R1 to R4 denote magnetoresistive thin films utilizing the giant magnetoresistance effect, and each of M11 to M14 denotes a metal/oxide/semiconductor field effect transistor (hereafter, referred to as "MOSFET"), and B1 denotes a bit wire, and J1 to J4 denote writing wires, and W1 to W4 denote word wires. A magnetic thin film memory of the present invention has a configuration in which a plurality of magnetic semiconductor hybrid elements each having a magnetoresistive thin film and a MOSFET connected in parallel are connected in series. By the way, FIG. 7 shows an example of connecting in series four magnetic semiconductor hybrid elements, but it is possible to operate as a magnetic thin film memory when two or more magnetic semiconductor hybrid elements are connected.

Figure 8A:
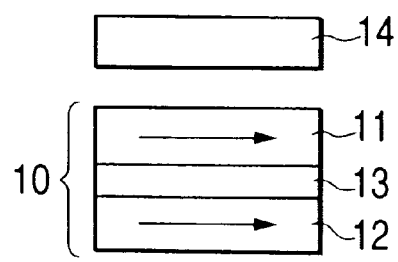
FIG. 8A and FIG. 8B are schematic cross-sectional views showing the configuration of a magnetoresistive thin film and a writing wire according to the first embodiment of the present invention.
Figure 8B:
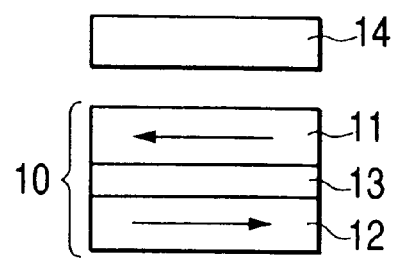

Each of FIG. 8A and FIG. 8B shows the structure of one selected from the magnetoresistive thin films R1 to R4 and one selected from the writing wires J1 to J4 shown in the circuit diagram of FIG. 7, and the magnetoresistive thin film is denoted by the numeral 10 and the writing wire is denoted by the numeral 14. The magnetoresistive thin film 10 has a configuration in which a magnetic layer 11 and a magnetic layer 13 holds a nonmagnetic layer 12 between them. Above the magnetoresistive thin film 10, a writing wire 14 is arranged for determining the direction of magnetization of the magnetic layer 11. FIG. 8A shows the relation between the writing wire and the magnetoresistive thin film in which the directions of magnetization of the magnetic layer 11 and the magnetic layer 13 are the same, and FIG. 8B shows the relation between the writing wire and the magnetoresistive thin film in which the directions of magnetization of the magnetic layer 11 and the magnetic layer 13 are opposite.

Next, a method of reading the information written in the magnetoresistive thin film of the magnetic thin film memory of the present invention will be described by using FIG. 7.

In order to read the information written in a specific magnetoresistive thin film among magnetoresistive thin films, a MOSFET arranged in parallel with the specific magnetoresistive thin film is turned off, and other MOSFET's are respectively turned on. For example, in FIG. 7, when reading out the information written in the magnetoresistive thin film R2, the MOSFET M12 is turned off, and the MOSFET M11, MOSFET M13 and MOSFET M14 are turned on, respectively. Next, when a predetermined voltage is applied to both ends of the bit wire B1, the current flows through the routes of the MOSFET M11, magnetoresistive thin film R2, MOSFET M13 and MOSFET M14. In this case, a current corresponding to the resistance value of the magnetoresistive thin film R2 flows through the magnetoresistive thin film R2. The magnetoresistive thin films R1 to R4 have two kinds of resistance values corresponding to the written information, for example, a large resistance value generated in the state where the information of "0" is written in it, and a small resistance value generated in the state where the information of "1" is written in it. Accordingly, since the magnitude of the resistance value of the magnetoresistive thin film R2 is determined by the current value of the magnetoresistive thin film R2, so that the information of "1" or "0" can be read.

In the above reading method, in the case when the MOSFET M11 to MOSFET M14 in FIG. 7 are n-type enhancement-type transistors, in order to read the information written in the magnetoresistive thin film R2, the gate electrode of the MOSFET M12 is grounded, and a plus potential of a threshold value or more are applied to the gate electrodes of other MOSFET M11, MOSFET M13 and MOSFET M14, respectively. The current flows only through the magnetoresistive thin film R2, and the current does not flow through the magnetoresistive thin film R1, the magnetoresistive thin film R3 and the magnetoresistive thin film R4 since the current flows in the direction of the channels of the MOSFET's connected to the respective magnetoresistive thin films in parallel. Accordingly, the resistance value of the magnetoresistive thin film R2 is determined by the current flowing through the magnetoresistive thin film R2, and the information of "1" or "0" can be read out.

Furthermore, in the case when the MOSFET M11 to MOSFET M14 are p-type depression-type transistors, in contrast with the case of the n-type enhancement-type transistors, the potential of the gate electrode of the MOSFET M12 is set to the threshold value or more, and the gate potentials of the MOSFET M11, MOSFET M13 and MOSFET M14 are set to zero potential, respectively. The control of the gate voltage is performed by using the word wires W1 to W4 connected to the gate electrodes of the MOSFET M11 to MOSFET M14. Then, the current flows only through the magnetoresistive thin film R2, and by the resistance value of the magnetoresistive thin film R2, the information of "1" or "0" can be read out.

Figure 9:
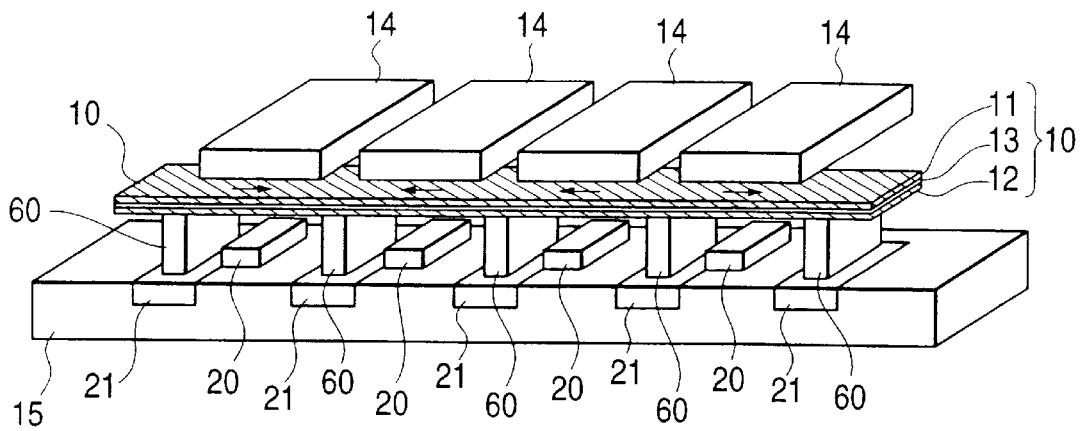
FIG. 9 is a schematic perspective view showing one example of the device configuration of a magnetic thin film memory according to the first embodiment of the present invention.

FIG. 9 shows an example of the device structure of the magnetic thin film memory shown in FIG. 7. The numeral 10 denotes a magnetoresistive thin film with a stacked structure in which a nonmagnetic layer 13 is interposed between a magnetic layer 11 and a magnetic layer 12. The numeral 14 denotes a writing wire, and the direction of magnetization of the magnetoresistive thin film 10 provided under the writing wire 14 is changed by using the magnetic field generated by flowing a current through the writing wire 14. Furthermore, the numeral 15 denotes a p-type Si substrate, the numeral 20 denotes a gate electrode of a MOSFET, and the numeral 21 denotes an n-type region of the p-type Si substrate 15 which is a source region and a drain region of a MOSFET. The magnetoresistive thin film 10 is electrically connected to an n-type semiconductor region 21 through a connecting electrode 60. The writing wire 14 is arranged above the magnetoresistive thin film 10, and it is arranged through an insulating film not shown in FIG. 9, so that it may not electrically be connected to the magnetoresistive thin film 10. Furthermore, the magnetoresistive thin film 10 is shown as a continuous film common to four memory cells, but it is also possible to provide and connect good conductors for separating memory cells on the upper portion of the connecting electrodes 60.

In FIG. 9, the source electrode of one MOSFET and the drain electrode of another adjacent MOSFET are used as a common electrode. Therefore, it is sufficient to provide one contact hole connecting the p-type Si substrate 15 and the magnetoresistive thin film 10 for each memory cell, and further, it is sufficient that the wires necessary for constituting one memory cell are two lines of wires of a writing wire 14 and a word wire 20 connected to the gate electrode. It is unnecessary to provide a field oxide film region for separating memory cells. Accordingly, in the magnetic thin film memory of the present invention, the number of lines of wires necessary for configuring one memory cell can be reduced to two, and it is sufficient that the number of a contact hole is one, and the field oxide film is not needed, so that the occupied area of the memory cell can be reduced, and a high degree of integration of a magnetic thin film memory can be realized at a low cost.

Next, a method of writing information in a magnetoresistive thin film 10 will be described by referring to FIG. 8A, FIG. 8B, and FIG. 9.

The writing of information in the magnetoresistive thin film 10 is performed by applying the magnetic field generated by flowing the current into the writing wire 14 to the magnetoresistive thin film 10. In the magnetic field generated by the current of the writing wire 14, the direction of the generated magnetic field changes when the direction of the current is changed. Accordingly, the direction of magnetization of the magnetic layer 11 is changed according to information to be written.

For example, as shown in FIG. 8A, FIG. 8B, and FIG. 9, when the current is supplied into the writing wire 14 from the back side of the figures toward the front side, a rightward magnetic field is applied to the magnetoresistive thin film 10. Conversely, when the current is supplied into the writing wire 14 from the front side of the figures toward the back side, a leftward magnetic field is applied to the magnetoresistive thin film 10. The magnitude of the magnetic field applied to the magnetoresistive thin film 10 is set so as to be larger than the coercive force of a layer in which information is written (hereafter, referred to as "memory layer") in the magnetoresistive thin film 10. For example, in FIG. 8A and FIG. 8B, when the magnetic layer 11 functions as a memory layer and the magnetic layer 12 functions as a layer (hereafter, referred to as "pin layer") whose coercive force is larger than that of the magnetic layer 11 and which previously has a predetermined direction of magnetization, the resistance value of the magnetoresistive thin film 10 changes when the direction of magnetization of the magnetic layer 11 which is a memory layer changes as shown in FIG. 8A and FIG. 8B, and the digital information of "0" or "1" is written in it.

In the example of the device structure shown in FIG. 9, an insulating material not shown in FIG. 9 is arranged between the magnetoresistive thin film 10 and the writing wire 14, and this is made for the purpose of efficiently generating the magnetic field from the writing 14. Furthermore, in FIG. 9, the writing wire 14 is arranged above the magnetoresistive thin film 10, but for example, when a second writing wire is arranged under the magnetoresistive thin film 10 through an insulating material, the magnetic fields generated from the writing wire 14 arranged above the magnetoresistive thin film 10 and the second writing wire arranged under the magnetoresistive thin film 10 are composed to increase the magnitude of the magnetic field, and so that information can surely be written in the magnetoresistive thin film 10.

In the above description, the magnetoresistive thin film 10 has such a configuration of the memory-layer/pin-layer in which the magnetic layer 11 is a memory layer and the magnetic layer 12 is a pin layer with a coercive force larger than that of the magnetic layer 11. However, it may have a configuration of the detection-layer/memory-layer in which the magnetic layer with a small coercive force is a detection layer and the magnetic layer with a large coercive force is a memory layer. In this case, it is possible to use a method of writing information in the memory layer and reading the information by changing only the direction of magnetization of the detection layer to the state of magnetization in the same direction or in the opposite direction, whereby the direction of magnetization of the memory layer is read by the change of the direction of magnetization thereof.

By the way, the magnetic thin film memory of the present embodiment is not limited to the circuit configuration and the device stricture shown in FIG. 7 to FIG. 9. For example, each of the MOSFET's M11 to M14 shown in FIG. 7 may comprise a junction type field effect transistor (JFET), a metal/semiconductor field effect transistor (MESFET), or a metal/insulator/semiconductor field effect transistor (MISFET) using an insulator other than an oxide film. However, it is most preferable to use the MOSFET from the viewpoint of the stability of the control when fining the memory cell or the like.

Furthermore, in the writing of information, it is sufficient to use means of either electrically or electromagnetically changing the resistance value of the magnetoresistive thin film 10, and the present invention is not limited to the above method.

SECOND EMBODIMENT

Figure 10:
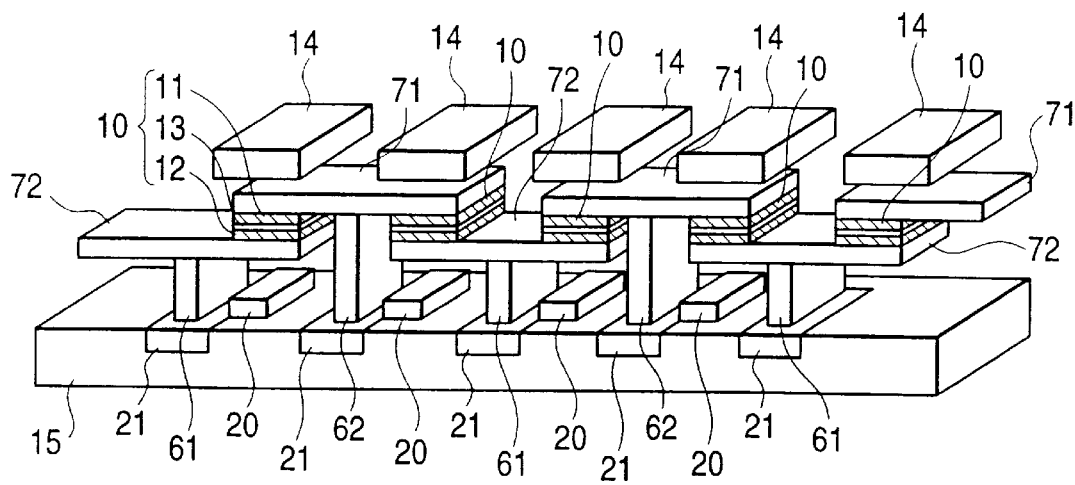
FIG. 10 is a schematic perspective view showing one example of the device configuration of a magnetic thin film memory according to the second embodiment of the present invention.

In the present embodiment, an example of the device structure of a magnetic thin film memory in a case of using a method in which the direction of the current when reading the information is perpendicular to the magnetoresistive thin film 10 (hereafter, referred to as "CPP method") will be described by referring to FIG. 10. As shown in FIG. 10, the magnetoresistive thin film 10 is connected to the n-type region 21 through a lower electrode 72 and a connecting electrode 61. Further, an upper electrode 71 is arranged on the magnetoresistive thin film 10. The upper electrode 71 and the lower electrode 72 are commonly used for one magnetoresistive thin film and another adjacent magnetoresistive thin film 10. Furthermore, above the upper electrode 71 of the magnetoresistive thin film 10, the writing wire 14 is arranged. In case of using the device structure shown in FIG. 10, it is also possible that the magnetic layer 11 constituting the magnetoresistive thin film 10 is replaced by the upper electrode 71 arranged on the magnetoresistive thin film 10, and the magnetic layer 12 constituting the magnetoresistive thin film 10 is replaced by the lower electrode 72 arranged under the magnetoresistive thin film 10.

THIRD EMBODIMENT

In the present embodiment, there will be described an example of the circuit and the device structure of a magnetic thin film memory in which the writing wire 14 in the device structure shown in FIG. 9 is replaced by the gate electrode 20 including a word wire.

Figure 11:
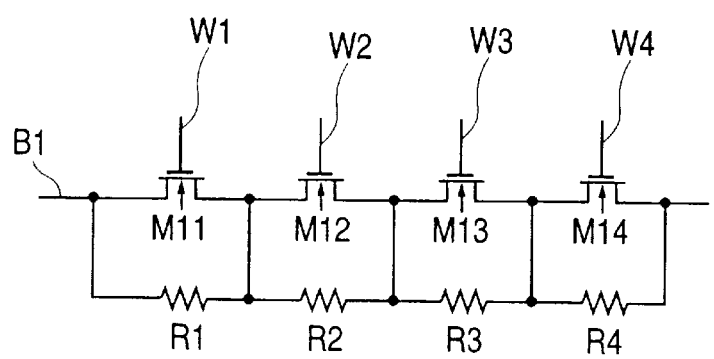
FIG. 11 is a circuit diagram showing the third embodiment of a magnetic thin film memory of the present invention.

FIG. 11 shows a circuit diagram in the case where the gate electrodes of the MOSFET M11 to MOSFET M14 shown in FIG. 7 are substituted for the writing wires W1 to W4. The gate wires of the MOSFET M11 to MOSFET M 14 are provided near the magnetoresistive thin films R1 to R4, which is not shown in FIG. 11.

Figure 12:
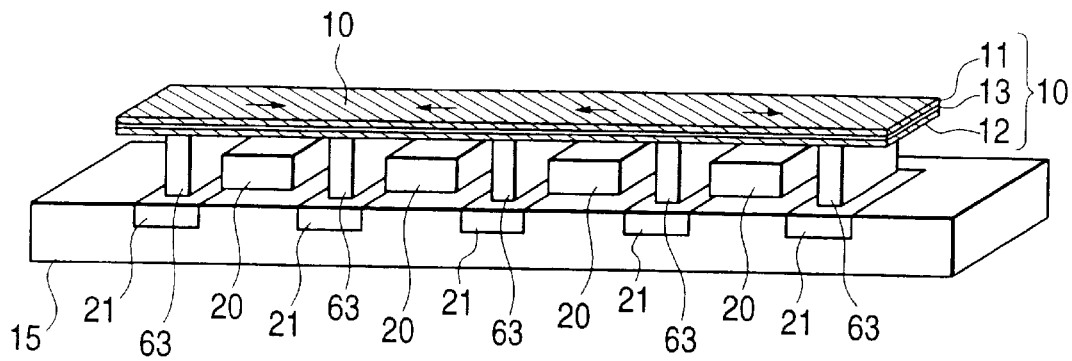
FIG. 12 is a schematic perspective view showing one example of the device configuration of a magnetic thin film memory according to the third embodiment of the present invention.

FIG. 12 shows an example of the device structure of the circuit of FIG. 11. It is the same as the device structure shown in FIG. 9 except that the writing wire 14 is not arranged above the magnetoresistive thin film 10. In the gate electrode 20, a current as a writing current flows from the front side of FIG. 12 to the back side or from the back side of FIG. 12 to the front side. Depending on the direction of this current, magnetic fields in the different directions are applied to the magnetoresistive thin film 10 arranged above the gate electrode 20, and different information is written in it depending on the direction of this magnetic field.

Furthermore, in addition to the device structure of FIG. 12, a writing wire 14 is further arranged above the magnetoresistive thin film 10, which is not shown in the drawings, and the combined magnetic fields generated by the currents flowing through the gate electrode 20 and the writing wire 14 is utilized, so that the magnetic field applied to the magnetoresistive thin film 10 can be enlarged.

Figure 13:
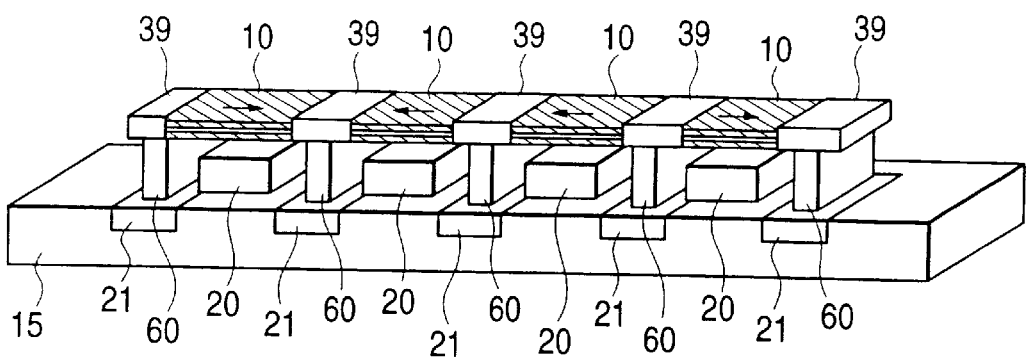
FIG. 13 is a schematic perspective view showing a modified example of the device configuration of a magnetic thin film memory according to the third embodiment of the present invention.

FIG. 13 is a view showing the connecting part between the magnetoresistive thin film 10 and the connecting electrode 63 in the device structure shown in FIG. 12 is replaced by a conductor material 39. By providing the conductor material 39, the influence of magnetism from another magnetoresistive thin film 10 can be prevented when writing the information.

Figure 14:
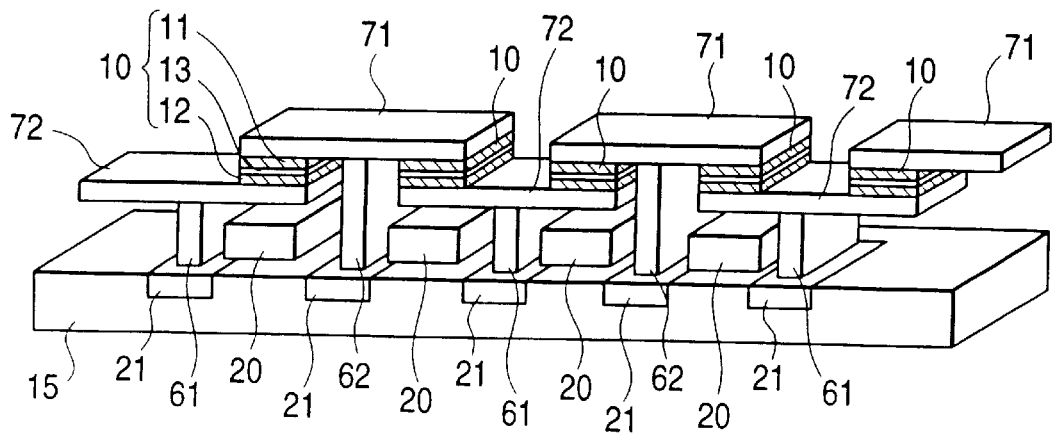
FIG. 14 is a schematic perspective view showing another modified example of the device configuration of a magnetic thin film memory according to the third embodiment of the present invention.

FIG. 14 shows a device structure where the writing wire 14 is replaced by the gate electrode 20 in the device structure using the magnetoresistive thin film 10 of the CPP method and shown in FIG. 10, and a structure like this can also be used.

FOURTH EMBODIMENT

In the present embodiment, there will be described a case where the writing current supplied into the writing wire 14 is replaced by the drain current.

Figure 15:
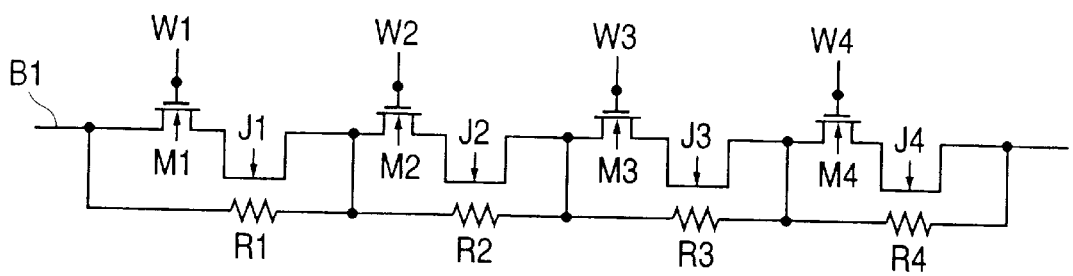
FIG. 15 is a circuit diagram showing the fourth embodiment of a magnetic thin film memory of the present invention.

FIG. 15 is a circuit diagram in which the wires from the source electrodes or the drain electrodes of the MOSFET M1 to MOSFET M4 function as the writing wires J1 to J4 and they are arranged near the magnetoresistive thin films R1 to R4. In this circuit diagram, in the case where information is written in the magnetoresistive thin film R2, the MOSFET M2 is turned on and the MOSFET M1, MOSFET M3 and MOSFET M4 are respectively turned off. In this state, when the voltage is applied to both ends of the bit wire B1, the current flows through the routes of R1, M2, J2, R3 and R4, and it is possible to write the information only into the magnetoresistive thin film R2 by using the magnetic field from the writing wire J2.

Figure 16:
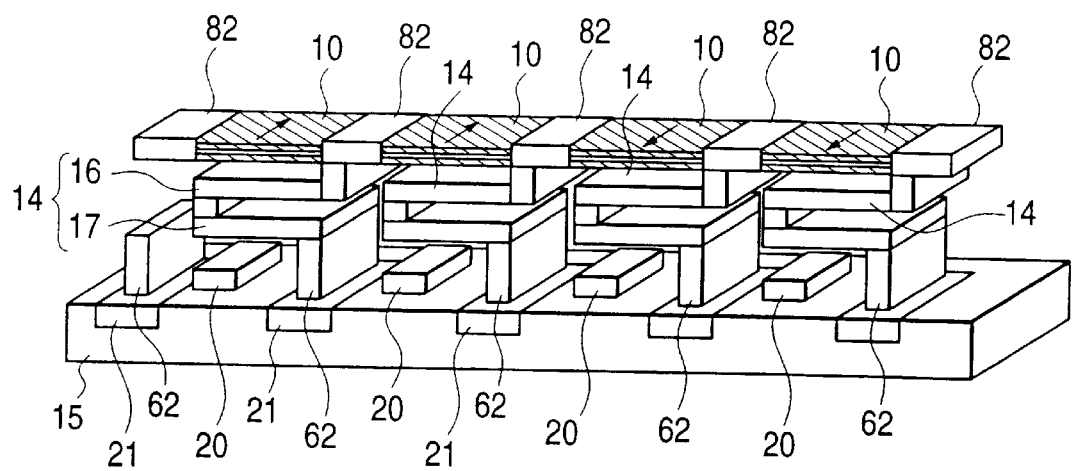
FIG. 16 is a schematic perspective view showing one example of the device configuration of a magnetic thin film memory according to the fourth embodiment of the present invention.

FIG. 16 shows one example of the device structure of the circuit of FIG. 15. The writing wire 14 from the drain electrode 62 to the magnetoresistive thin film 10 is bent to provide a writing wire 16 and a writing wire 17, and they are arranged near the magnetoresistive thin film 10. The writing into the magnetoresistive thin film 10 is performed by using the magnetic field generated from the writing wire 16. In FIG. 16, the magnetoresistive thin film 10 is separated by a conductor material 82, but of course, it may also be a continuous magnetoresistive thin film 10. However, by providing the conductor material 82, the influence of magnetism from other magnetoresistive thin films 10 can be prevented when writing information. Furthermore, the conductor material 82 may be a magnetic material for stabilizing the state of magnetization of the magnetoresistive thin film 10. This is provided for the purpose of cutting the influence caused by the increase of the diamagnetic field when fining the magnetoresistive thin film 10, and for example, it is used for the purpose of making the magnetic layer 11 and the magnetic layer 12 in FIG. 8A and FIG. 8B the closed magnetic circuits. This can be applied to other embodiments.

Furthermore, in FIG. 16, the writing is performed by using the magnetic field generated from the bent writing wire 16, but if both magnetic fields generated from the bent writing wire 16 and writing wire 17 are combined, the magnitude of the magnetic field is increased, which is more preferable.

FIFTH EMBODIMENT

In the present embodiment, a case where the writing current is replaced by the drain current similarly to the fourth embodiment will be described, but a case where the writing wire is not commonly used for the adjacent memory cells will be described.

Figure 17:
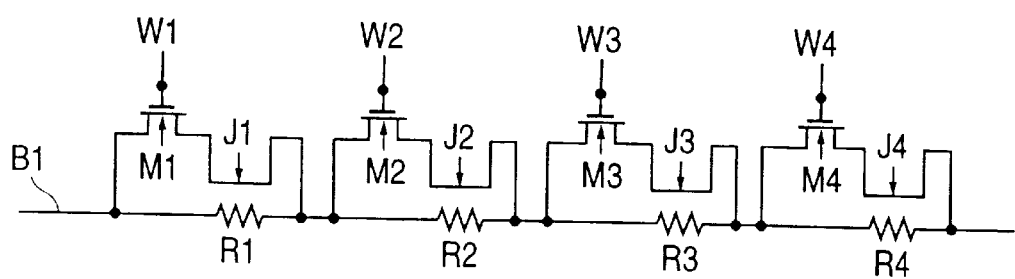
FIG. 17 is a circuit diagram showing the fifth embodiment of a magnetic thin film memory of the present invention.
Figure 18:
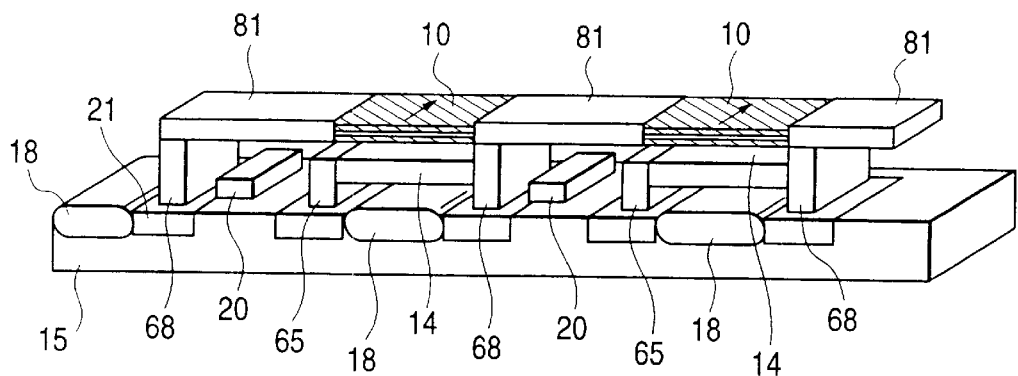
FIG. 18 is a schematic perspective view showing one example of the device configuration of a magnetic thin film memory according to the fifth embodiment of the present invention.

FIG. 17 shows a circuit diagram of the above case. Furthermore, FIG. 18 shows an example of the device structure of the circuit of FIG. 17, and either the source electrode or the drain electrode of the NOSFET is connected to a good conductor material 81 through the connecting electrode 68, and further, the good conductor material 81 is connected to the magnetoresistive thin film 10. The good conductor material 81 is substituted for a part where the magnetic field generated by the current flowing through the writing wire 14 does not reach the magnetoresistive thin film.

Either the source electrode or the drain electrode of the MOSFET which is not connected to the good conductor material 81 is connected to the connecting electrode 68 of the adjacent MOSFET through the writing wire 14 arranged under the magnetoresistive thin film 10 through the connecting electrode 65. The writing of the information into the magnetoresistive thin film 10 is performed by the method described in the fourth embodiment by using the magnetic field generated by the current flowing into the writing wire 14 through the drain electrode of the MOSFET. By the way, all good conductor materials 81 may be a magnetic material for stabilizing the state of magnetization of the magnetoresistive thin film 10, and furthermore, a part thereof may be a magnetic material.

In the example of the device structure shown in FIG. 18, two contact holes for the connection to the p-type Si substrate are necessary for one memory cell, and the field oxide film region 18 composed of $SiO_2$ is also necessary for the separation of the memory cells which is essential in the device structure of a conventional magnetic thin film memory. Therefore, the degree of integration is lower than that of the device structure of the first embodiment. However, the number of lines of wires used in the present embodiment may be smaller than that of a conventional magnetic thin film memory, so that the structure can be simplified. Furthermore, it is unnecessary to provide a writing wire 14, so that the degree of integration can be higher than that of a conventional magnetic thin film memory.

SIXTH EMBODIMENT

In the present embodiment, there will be described a case where the memory cells of a magnetic thin film memory are integrated.

Figure 19:
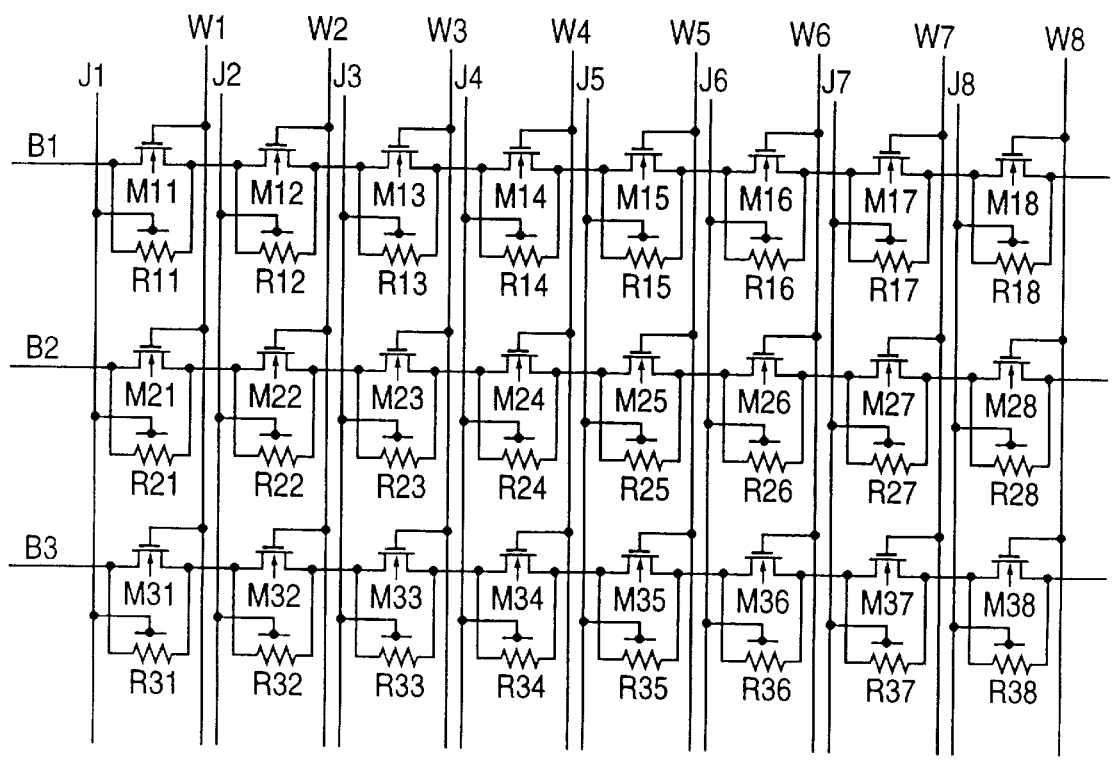
FIG. 19 is a circuit diagram showing the sixth embodiment of a magnetic thin film memory of the present invention.

FIG. 19 shows a circuit diagram of an integrated magnetic thin film memory in which the circuits of the magnetic thin film memory of the present invention shown in FIG. 7 are arranged in a matrix state. The reference characters R11 to R38 denote magnetoresistive thin films, and M11 to M38 denote MOSFET's. Furthermore, W1 to W8 denote word wires, B1 to B3 denote bit wires, and J1 to J8 denote writing wires.

Next, a case where the information of a specific magnetoresistive thin film among a plurality of magnetoresistive thin films is read in the integrated magnetic thin film memory shown in FIG. 19 will be described by taking up an example of reading the information written in the magnetoresistive thin film R23.

First, only the word wire W3 is grounded and the MOSFET M23 is turned off, and the potential is applied to other word wires W1, W2 and W4 to W8 and all MOSFET's except for the MOSFET M23 are turned on. Next, when the potential is applied to the bit wire B2, the current flows only through the magnetoresistive thin film R23 among the magnetoresistive thin films R21 to R28 connected to the bit wire B2. At this moment, by the magnitude of the resistance value of the magnetoresistive thin film R23, the information can be read out.

In the above embodiment, a case where the type of the structure of the MOSFET is the n-type enhancement-type has been described. But in the case where a p-type depression-type MOSFET is used, it is sufficient that the potential is applied only to the word wire W3 and the potential of other word wires W1, W2 and W4 to W8 is set at zero. Therefore, it is preferable that the type of a MOSFET used in an integrated magnetic thin film memory is the p-type depression-type.

Next, a case where information is written in a specific magnetoresistive thin film, for example, the magnetoresistive thin film R23 will be described. First, the current is supplied into the writing wire J3 and at the same time, the current is also supplied into the bit wire B2, so that the current may also flow through the magnetoresistive thin film R23 itself. Then, a strong combined magnetic field is generated only near the magnetoresistive thin film R23. By this composed magnetic field, the information can be written only in the magnetoresistive thin film R23.

Furthermore, in the case where the gate electrodes of the MOSFET M11 to the MOSFET M38 are also used as the writing wires J1 to J8, the magnetic fields generated by the currents flowing through the gate electrodes of the MOSFET M11 to the MOSFET M38 and the magnetoresistive thin films R11 to R38 are combined to perform the writing. In the case where the drain current is used as the writing current, the writing can be performed by using the method described in the fourth embodiment.

Figure 20:
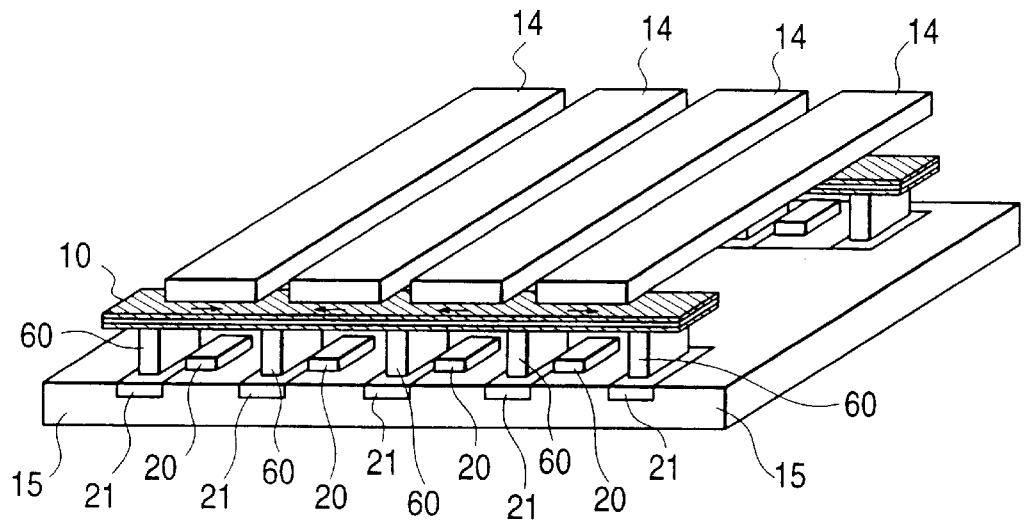
FIG. 20 is a schematic perspective view showing one example of the device configuration of a magnetic thin film memory according to the sixth embodiment of the present invention.
Figure 21:
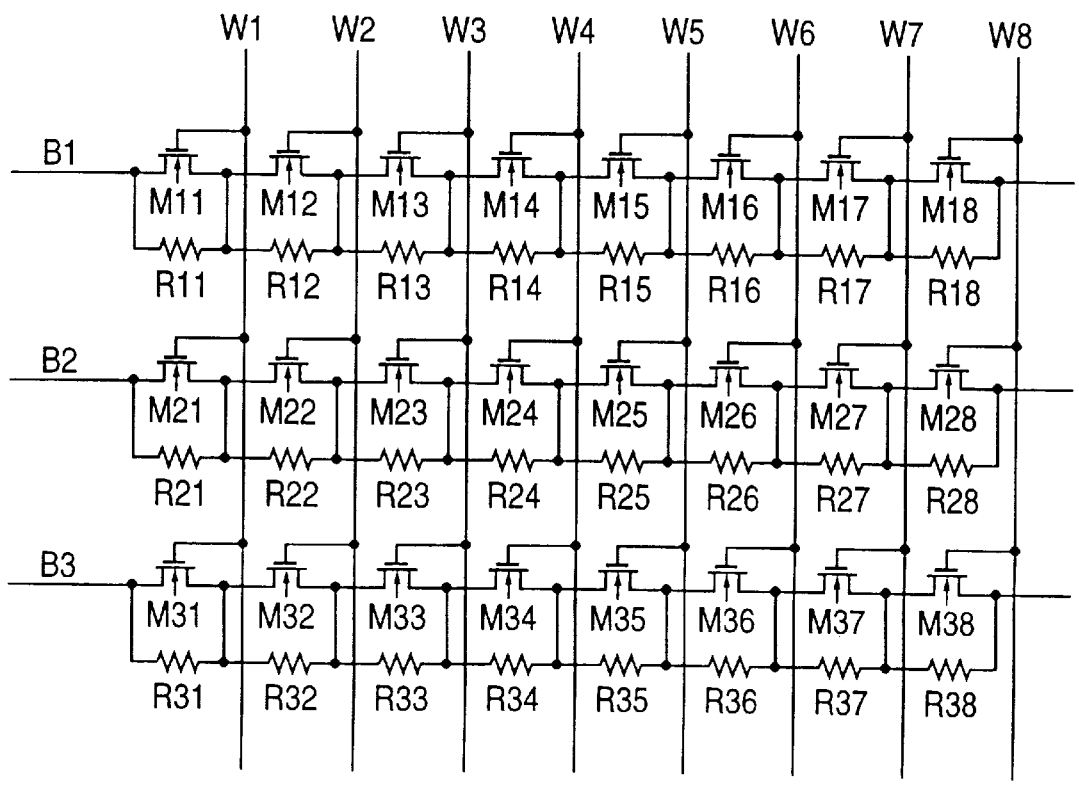
FIG. 21 is a circuit diagram showing a modified example of the sixth embodiment of a magnetic thin film memory of the present invention.

Both in the above case where the gate electrodes of the MOSFET M11 to the MOSFET M38 are also used as the writing wires J1 to J8, and in the above case where the drain currents of the MOSFET M11 to the MOSFET M38 are used as the writing currents to perform the writing, the writing wires J1 to J8 are unnecessary, and the circuit of the integrated magnetic thin film memory shown in FIG. 19 can be simplified as shown in FIG. 21. FIG. 20 shows one example of the device structure of an integrated magnetic thin film memory, and the writing wires J1 to J8 and different thin film memory lines are commonly used.

SEVENTH EMBODIMENT

In the above respective embodiments, a case where the magnetoresistive thin film using a film with a giant magnetoresistance (hereafter, referred to as "GMR") effect has been described as an example, and in the present embodiment, the principle of the magnetoresistive thin film of GMR will be described.

The magnetoresistive thin films of GMR include kinds of magnetoresistive thin films such as a spin tunnel type or a spin dependence scattering type, and depending on the kinds thereof, the absolute values of the resistance values are different. The absolute value of the resistance value of a spin dependence scattering type magnetoresistive thin film is about 20 Ω, and the rate of change of the resistance value caused by differences in magnetization direction is about 5% to about 10%. On the other hand, the absolute value of the resistance value of a spin tunnel type magnetoresistive thin film is several kΩ, and the rate of change of the resistance value caused by differences in magnetization direction is about 10% to about 30%.

In the magnetic thin film memory of the present invention, a MOSFET and a magnetoresistive thin film are connected in parallel. When the MOSFET connected in parallel to the magnetoresistive thin film performing the writing and reading of information is referred to as "selective transistor", in the case when the selective transistor is turned on, the current flows through the selective transistor, and in the case when the selective transistor is turned off, the current flows through the magnetoresistive thin film. Therefore, it is necessary for the resistance value of the magnetoresistive thin film to be sufficiently larger than that of the ON-resistor of the selective transistor, and it is preferable to use a spin tunnel type magnetoresistive thin film whose resistance value is sufficiently larger than that of a spin dependence type magnetoresistive thin film.

Next, as for a spin dependence scattering type magnetoresistive thin film and a spin tunnel type magnetoresistive thin film, the features of a magnetic layer and a nonmagnetic layer constituting the magnetoresistive thin film will be described. As mentioned above, the magnetoresistive thin film is formed such that a nonmagnetic layer is interposed between two magnetic layers which are a magnetic layer with a small coercive force and a magnetic layer with a large coercive force (hereafter, the magnetic layer with a small coercive force is referred to as "first magnetic layer", and the magnetic layer with a large coercive force is referred to as "second magnetic layer").

First, a concrete example of a spin dependence scattering type magnetoresistive thin film will be described.

In the spin dependence scattering type magnetoresistive thin film, the scattering of conduction electrons is considerably different depending on the spin. That is, since the conduction electrons having a spin in the same direction as the magnetization direction are not so much scattered, the resistance value is small. But since the conduction electrons having a spin in the opposite direction to the magnetization direction are much scattered, the resistance value is large. Therefore, in the case where the magnetization directions of the first magnetic layer and the second magnetic layer are opposite, the resistance value is large, and in the case where the magnetization directions of the first magnetic layer and the second magnetic layer are the same, the resistance value decreases.

As for the flowing direction of the current used when performing the reading, there are a method of flowing the current in parallel with the surface of the magnetic resistance film (hereafter, referred to as "CIP method") and the above CPP method. In the spin dependence scattering type, both the CIP and the CPP methods can be used, but it is preferable to use the CIP method since the absolute value of the resistance of the magnetoresistive thin film can be made larger and the output voltage is larger.

Next, as for the first magnetic layer, the second magnetic layer, and the nonmagnetic layer of the spin dependence scattering type magnetoresistive thin film, the features of the respective layers will be described. The material of the first magnetic layer and the second magnetic layer preferably is a material containing at least one kind selected from Ni, Fe and Co as the main component, or an amorphous alloy containing CoFe as the main component. For example, NiFe, NiFeCo, Fe, FeCo or CoFeB is preferably used.

(Material of first magnetic layer)

The first magnetic layer has a coercive force smaller than that of the second magnetic layer. Therefore, the material of the first magnetic layer preferably is a soft magnetic material containing Ni. Specifically, it is preferably a material containing NiFe or NiFeCo as the main component. In the atomic composition of NiFeCo which is shown by $Ni_xFe_yCo_z$, x is 40 or more and 95 or less, y is 0 or more and 40 or less, and z is 0 or more and 50 or less. Preferably, x is 50 or more and 90 or less, y is 0 or more and 30 or less, and z is 0 or more and 40 or less. More preferably, x is 60 or more and 85 or less, y is 10 or more and 25 or less, and z is 0 or more and 30 or less.

Furthermore, as the first magnetic layer, it is also possible to use a magnetic material of FeCo with a lot of Fe amount or an amorphous magnetic material with a small coercive force such as CoFeB. In the atomic composition of FeCo which is shown by $Fe_xCo_{100-x}$, x is 50 or more and 100 or less, and preferably, x is 60 or more and 90 or less. In the atomic composition of CoFeB which is shown by $(Co_xFe_{100-x})_{100-y}B_y$, x is 80 or more and 96 or less, and y is 5 or more and 30 or less. Preferably, x is 86 or more and 93 or less, and y is 10 or more and 25 or less.

(Material of second magnetic layer)

The second magnetic layer has a coercive force larger than that of the first magnetic layer. Therefore, it is preferable to use a magnetic material which contains, for example, a larger amount of Co when compared with the first magnetic layer, as the material of the second magnetic layer. In the case of NiFeCo whose atomic composition ratio is shown by $Ni_xFe_yCo_z$, x is 0 or more and 40 or less, y is 0 or more and 50 or less, and z is 20 or more and 95 or less. Preferably, x is 0 or more and 30 or less, y is 5 or more and 40 or less, and z is 40 or more and 90 or less. More preferably, x is 5 or more and 20 or less, y is 10 or more and 30 or less, and z is 50 or more and 85 or less.

In the case of FeCo whose composition is shown by $Fe_xCo_{100-x}$, x is 0 or more and 50 or less. Furthermore, it is also possible to add an additional element such as Pt to the second magnetic layer for the purpose of conspicuousness of the coercive force, improvement of the corrosion resistance or the like.

(Method of controlling coercive force of magnetic layer)

When Fe is added to Co, the coercive force becomes lower, and when Pt is added, the coercive force becomes larger. For example, in the case of the second magnetic layer whose composition of elements is shown by $Co_{100-x-y}Fe_xPt_y$, the coercive force can be controlled by adjusting x and y in the composition of elements. Furthermore, it is also possible to lower the coercive force by adding Ni. Moreover, it is also possible to increase the coercive force by raising the temperature of the substrate during film formation when forming the magnetic layer.

It is also possible to combine this method of controlling the temperature of the substrate during the film formation and the above method of controlling the composition of the ferromagnetic material. Further, the coercive force in the first magnetic layer can also be controlled by using the method of controlling the composition of the magnetic material and the temperature of the substrate during the film formation, similarly to the above. Furthermore, since the coercive force can be enlarged when the film thickness is increased, it is also possible to differentiate the coercive forces of the magnetic layers by changing the film thickness.

(Thickness of first magnetic layer)

The thickness of the first magnetic layer is set so that the GMR effect of a spin dependence scattering type magnetoresistive thin film may efficiently be created. Specifically, when the thickness of the first magnetic layer is considerably larger than the mean free path of electrons, the electrons receive the phonon scattering and the mean free path is reduced. Therefore, it is preferable that the thickness of the first magnetic layer is 200 Å or less at most. More preferably, it is 150 Å or less. However, when the thickness of the first magnetic layer is extremely thin, the resistance value of the magnetoresistive thin film becomes small and the output of the regenerative signal is reduced, and it becomes difficult to keep the magnetization. Therefore, the thickness is preferably 20 Å or more, and more preferably 80 Å or more.

(Thickness of second magnetic layer)

The thickness of the second magnetic layer preferably is 200 Å or less at most so that the GMR effect of a spin dependence scattering type magnetoresistive thin film may efficiently be created similarly to the case of the first magnetic layer. More preferably, the thickness is 150 Å or less. However, when the thickness of the second magnetic layer is extremely thin, the degradation of the memory holding performance, the reduction of the output of the regenerative signal, the lowering of the resistance value of the magnetoresistive thin film and the like are caused similarly to the case of the first magnetic layer, so that the magnetization cannot be kept, and therefore, the thickness is 20 Å or more, and preferably 80 Å or more.

(Material and thickness of nonmagnetic layer)

Here, the material of the nonmagnetic layer and the thickness of the nonmagnetic layer will be described.

The material of a nonmagnetic layer includes a good conductor material, and it is preferable to use a good conductor material containing Cu as the main component. Use of the good conductor material containing Cu as the main component provides good adhesion properties between the nonmagnetic layer and the magnetic layer since the Felmi level of the nonmagnetic layer is near that of the magnetic layer, and it further provides a large magnetic resistance value since, when the direction of magnetization of the magnetic layer changes, the resistance is easily generated at the interface between the nonmagnetic layer and the magnetic layer. The thickness of a nonmagnetic layer is preferably 5 Å or more and 60 Å or less.

(Others)

Here, there will be described the method of obtaining a high SN ratio by enlarging the resistance value of a magnetoresistive thin film.

In order to enlarge the resistance value of a magnetoresistive thin film to obtain a high SN ratio, a magnetic material containing Co as the main component is preferably inserted either or both between the first magnetic layer and the nonmagnetic layer and between the second magnetic layer and the nonmagnetic layer. The thickness of the magnetic material to be inserted preferably is 20 Å or less. In order to further improve the SN ratio, a first magnetic layer, a nonmagnetic layer, a second magnetic layer and a nonmagnetic layer are stacked in this order to form one unit. The unit is stacked a plurality of times to form a magnetoresistive thin film. The resistance value of the magnetoresistive thin film preferably becomes larger as the number of stacked units is increased. But when the number of stacked units is extremely large, the thickness of the magnetoresistive thin film becomes large and a lot of currents are needed. Therefore, the number of stacked units is 40 or less, and preferably about 3 to about 20.

EIGHTH EMBODIMENT

In the present embodiment, a magnetic thin film memory using the CPP method in which the current is supplied in a direction perpendicular to the film surface of the magnetoresistive thin film will be described by referring to FIG. 10.

In the CPP method, the second magnetic layer is connected to either the lower electrode of the magnetoresistive thin film 10 or the upper electrode of the magnetoresistive thin film 10. The first magnetic layer is connected to either the upper electrode of the magnetoresistive thin film 10 or the lower electrode of the magnetoresistive thin film 10. When the potential is applied between the upper electrode of the magnetoresistive thin film 10 and the lower electrode of the magnetoresistive thin film 10, the current flows through the magnetoresistive thin film 10 in the order of the first magnetic layer, the nonmagnetic layer and the second magnetic layer, or the current flows in the opposite order thereto, that is, in the order of the second magnetic layer, the nonmagnetic layer and the first magnetic layer. This phenomenon will be described in the case where a spin tunnel type magnetoresistive thin film is used.

(Material and thickness of spin tunnel type magnetoresistive thin film)

A spin tunnel type magnetoresistive thin film has a configuration of a first magnetic layer, a nonmagnetic layer, and a second magnetic layer. A thin insulating material is used for the nonmagnetic layer. When the current is supplied in the direction perpendicular to the magnetoresistive thin film at the time of performing the reading, the electrons tunnel from the first magnetic layer to the second magnetic layer.

When the magnetic layer of the magnetoresistive thin film is a ferromagnetic metal, the conduction electrons cause spin polarizing, and on the Fermi surface, the states of electrons of the upward spin and the downward spin are different. When a ferromagnetic tunnel junction consisting of ferromagnetic-layer/insulator/ferromagnetic-layer is formed by using a ferromagnetic metal like this, the conduction electrons tunnel from the first magnetic layer to the second magnetic layer while keeping the spin. The probability that the electrons tunnel is changed by the states of magnetization of the first magnetic layer and the second magnetic layer, and the change of this tunneling provability becomes the change of the tunnel resistance. As a result of this, in the case where the magnetization directions of the first magnetic layer and of the second magnetic layer are the same, the tunnel resistance is small, and in the case where the magnetization directions of the first magnetic layer and of the second magnetic layer are different, the tunnel resistance is large.

When the difference between the state density of the upward spin and the state density of the downward spin on the Fermi surface is large, the tunnel resistance becomes large and a larger reading signal can be obtained. Accordingly, it is preferable to use a magnetic material with a large spin polarizability for the first magnetic layer and the second magnetic layer.

For the material to be used for the first magnetic layer and the second magnetic layer of a spin tunnel type magnetoresistive thin film, the same material as the material used for the first magnetic layer and the second magnetic layer of the above spin dependence scattering type magnetoresistive thin film can be used. But in order to increase the resistance value of the magnetoresistive thin film, it is preferable that the material contains Fe having a large quantity of polarizing of the upward spin and the downward spin on the Fermi surface and Co as the second component. Furthermore, Ni can be added to the material. Therefore, it is preferable to use Fe, FeCo, Co, NiFe, or NiFeCo. More specifically, it is preferable to use $Ni_{72}Fe_{28}$, $Ni_{51}Fe_{49}$, $Ni_{42}Fe_{58}$, $Ni_{25}Fe_{75}$, $Ni_9Fe_{91}$ or the like.

Further, in order to decrease the coercive force of the first magnetic layer, it is preferable to use materials such as NiFe, NiFeCo, Fe or the like. Furthermore, in contrast with the above, in order to increase the coercive force of the second magnetic layer, it is preferable to use a material containing Co as the main component.

(Thickness of magnetic layer)

Next, the thickness of the first magnetic layer and the second magnetic layer of a spin tunnel type magnetoresistive thin film will be described.

It is preferable that the thickness of the first magnetic layer and the second magnetic layer is more than 100 Å and not more than 5000 Å.

The first reason for the above is as follows. In the case when an oxide is used as the material of a nonmagnetic layer, the magnetism of the interfaces between the first magnetic layer and the nonmagnetic layer and between the second magnetic layer and the nonmagnetic layer is weakened under the influence of this oxide, and this appears remarkably in the case where each thickness of the first magnetic layer and the second magnetic layer is small.

The second reason for the above is as follows. In the case where $Al_2O_3$ is used as the material of a nonmagnetic layer, when a method of forming Al into a film and then introducing oxygen is used as the $Al_2O_3$ forming method, Al with a thickness of several tens Å which is not oxidized regardless of the introduction of oxygen is left. In the case when each thickness of the first magnetic layer and the second magnetic layer is 100 Å or less, the influence of the left Al becomes large and proper memory characteristics cannot be obtained.

The third reason for the above is as follows. Especially, in the case when the magnetic thin film memory is fined into a submicron scale, the memory holding performance of the first magnetic layer and the constant magnetization holding performance in the second magnetic layer are weakened. Furthermore, when the first magnetic layer and the second magnetic layer are too thick, a problem that the resistance value becomes too large or the like is caused, and therefore, each thickness of the first magnetic layer and the second magnetic layer is preferably 5000 Å or less. More preferably, it is 1000 Å or less.

(Material of nonmagnetic layer)

In the present embodiment, the material of the nonmagnetic layer of a spin tunnel type magnetoresistive thin film will be described.

The material of the nonmagnetic layer of a spin tunnel type magnetoresistive thin film should be an insulator so that the electrons can tunnel while keeping the spin. However, it is possible that the whole of the nonmagnetic layer is composed of an insulator material, and it is also possible that a part of the nonmagnetic layer is composed of an insulating material. Furthermore, when a part of the nonmagnetic layer is an insulator and the thickness thereof is extremely reduced, the GMR effect by the spin tunnel can further be increased.

It is preferable to use $AlO_x$, $AlN_x$, $SiO_x$ or $SiN_x$ for a concrete material of the nonmagnetic layer. A material containing NiO. as the main component may also be used. The reason therefor is as follows. In order that the spin tunnel may occur, it is necessary that there is a proper potential barrier in the energy of the conduction electrons of the first magnetic layer and the second magnetic layer, and it is comparatively easy to obtain this potential barrier in the above material.

(Thickness of nonmagnetic layer)

The thickness of a nonmagnetic layer is preferably uniform and several tens Å, and the thickness of the part of the insulator material is preferably 5 Å or more and 30 Å or less.

The reason for the above is as follows. When the thickness of a nonmagnetic layer is less than 5 Å, there is a possibility that the first magnetic layer and the second magnetic layer are electrically short-circuited, and when the thickness of the nonmagnetic layer exceeds 30 Å, the tunnel phenomenon of electrons does not occur. Accordingly, it is preferable that the thickness of a nonmagnetic layer is 5 Å or more and 25 Å or less, and it is more preferable that it is 5 Å or more and 18 Å or less.

(Antiferromagnetic layer)

In the spin dependence scattering type magnetoresistive thin film by the CPP and CIP methods and the spin tunnel type magnetoresistive thin film by the CPP and CIP methods as mentioned above, it is also possible that an antiferromagnetic layer is provided in contact with the surface of the second magnetic layer which is not in contact with the nonmagnetic layer so that the magnetization of the second magnetic layer may be fixed by the exchange coupling force between this antiferromagnetic layer and the second magnetic layer. As a result of this, it is possible to increase the coercive force of the second magnetic layer by the exchange coupling force with the antiferromagnetic layer.

The same material as the first magnetic layer and the second magnetic layer can be used for the material of the antiferromagnetic layer, and since the coercive force can be increased without damaging the resistance value of the magnetoresistive thin film, the scope of selection of materials is widened. NiO, FeMn, IrMn, CoO or the like is preferably used for the material of an antiferromagnetic layer.

The above antiferromagnetic layer is used mainly for the purpose of increasing the coercive force of the second magnetic layer and for the purpose of fixing the coercive force of the second magnetic layer, but it is also possible to provide an antiferromagnetic layer for the purpose of adjusting the coercive force of either the first magnetic layer or the second magnetic layer, or the coercive forces of both the first magnetic layer and the second magnetic layer.

What is claimed is:

1. A magnetic thin film memory comprising a hybrid element comprising a field effect transistor and a spin tunnel type magnetic resistor connected to said field effect transistor in parallel, wherein said magnetic resistor comprises a first magnetic layer and a second magnetic layer having a coercive force larger than that of said first magnetic layer, said first and second magnetic layers begin stacked, and a nonmagnetic layer sandwiched between said first and second magnetic layers, said nonmagnetic layer having a thickness of 5 to 30 Å.

2. The magnetic thin film memory according to claim 1, further comprising means for performing reading and writing of information by electrically or electromagnetically changing a resistance value of said magnetoresistive thin film.

3. The magnetic thin film memory according to claim 1, wherein said hybrid element is arranged in plurality in a matrix state.

4. The magnetic thin film memory according to claim 2, wherein said hybrid element is arranged in plurality in a matrix state.

5. The magnetic thin film memory according to claim 3, wherein a source electrode of a field effect transistor of one hybrid element among said hybrid elements and a drain electrode of a field effect transistor of another hybrid element adjacent to said one hybrid element are a common electrode.

6. The magnetic thin film memory according to claim 4, wherein a source electrode of a field effect transistor of one hybrid element among said hybrid elements and a drain electrode of a field effect transistor of another hybrid element adjacent to said one hybrid element are a common electrode.

7. The magnetic thin film memory according to claim 1, wherein said field effect transistor comprises a MOS (metal/oxide/semiconductor) field effect transistor.

8. The magnetic thin film memory according to claim 1, wherein said field effect transistor comprises a p-type depression-type transistor.

9. The magnetic thin film memory according to claim 1, wherein said first magnetic layer comprises a soft magnetic material containing Ni.

10. The magnetic thin film memory according to claim 1, wherein said second magnetic layer comprises a magnetic material containing Co.

11. A method of reading information from the magnetic thin film memory according to claim 3, which comprises the steps of:

switching off a field effect transistor of one hybrid element of which information is read out, among a plurality of hybrid elements connected in series;

switching on a field effect transistor of another hybrid element other than said one hybrid element; and discriminating information stored in said one hybrid element from resistance values of said plurality of hybrid elements connected in series.

12. A method of reading information from the magnetic thin film memory according to claim 4, which comprises the steps of:

switching off a field effect transistor of one hybrid element of which information is read out, among a plurality of hybrid elements connected in series;

switching on a field effect transistor of another hybrid element other than said one hybrid element; and discriminating information stored in said one hybrid element from resistance values of said plurality of hybrid elements connected in series.

13. A method of writing information in the magnetic thin film memory according to claim 3, which comprises the steps of:

switching on a field effect transistor of one hybrid element in which information is written, among a plurality of hybrid elements connected in series;

switching off a field effect transistor of another hybrid element other than said one hybrid element; and supplying current to a plurality of hybrid elements connected in series to writing information in said one hybrid element by a magnetic field generated by drain current flowing through said field effect transistor of said one hybrid element.

14. A method of writing information in the magnetic thin film memory according to claim 4, which comprises the steps of:

switching on a field effect transistor of one hybrid element in which information is written, among a plurality of hybrid elements connected in series;

switching off a field effect transistor of another hybrid element other than said one hybrid element; and supplying current to a plurality of hybrid elements connected in series to writing information in said one hybrid element by a magnetic field generated by drain current flowing through said field effect transistor of said one hybrid element.

* * * * *